United States Patent
Nishikawa et al.

(10) Patent No.: US 7,326,902 B2
(45) Date of Patent: Feb. 5, 2008

(54) IMAGE PICKUP DEVICE FOR MINIMIZING IMAGE DEGRADATION FROM STRAY LIGHT FLUX ENTERING ITS STRUCTURE

(75) Inventors: Takuo Nishikawa, Fussa (JP); Hiroshi Takahashi, Hachioji (JP); Kazuo Tansho, Mizuho-machi (JP)

(73) Assignee: Konica Minolta Opto, Inc., Tokyo (JP)

( * ) Notice: Subject to any disclaimer, the term of this patent is extended or adjusted under 35 U.S.C. 154(b) by 6 days.

(21) Appl. No.: 11/368,909

(22) Filed: Mar. 6, 2006

(65) Prior Publication Data
US 2006/0202106 A1 Sep. 14, 2006

(30) Foreign Application Priority Data
Mar. 14, 2005 (JP) .............................. 2005-071235

(51) Int. Cl.
*H01L 27/00* (2006.01)
(52) U.S. Cl. .................................... 250/208.1; 250/239
(58) Field of Classification Search ............. 250/208.1, 250/214.1, 214 R, 239; 348/281–302; 257/290–292
See application file for complete search history.

(56) References Cited

U.S. PATENT DOCUMENTS 6,618,087 B1 * 9/2003 Hokari et al. ............... 348/311
7,030,918 B1 * 4/2006 Nakashiba .................. 348/294

* cited by examiner

*Primary Examiner*—Que T Le
(74) *Attorney, Agent, or Firm*—Cohen Pontani Lieberman & Pavane LLP

(57) ABSTRACT

An image pickup device includes an optical member; a semiconductor image pickup element having a photoelectric converter for photoelectrically converting a light flux converged by the optical member into electric signal and for storing the electric signal thereon, and an analog circuit being adjacent to the photoelectric converter for outputting the stored electric signal in the photoelectrical converter; and an incident light preventing portion for preventing a light flux from a space between a wiring layer provided on the analog circuit and a wiring layer provided on the photoelectric converter.

5 Claims, 8 Drawing Sheets

IMAGE PICKUP DEVICE FOR MINIMIZING IMAGE DEGRADATION FROM STRAY LIGHT FLUX ENTERING ITS STRUCTURE

This appliaction is based on Japanese Patent Application No. 2005-071235 filed on Mar. 14, 2005, in Japanese Patent Office, the entire content of which is hereby incorporated by reference.

FIELD OF THE INVENTION

The present invention relates to an image pickup device capable of being mounted on an electronic apparatus such as a cell-phone and a mobile computer, and to an electronic apparatus having a built-in image pickup device.

BACKGROUND OF THE INVENTION

There has so far been developed a small-sized and highly efficient image pickup device capable of being mounted on an electronic apparatus such as a cell-phone and a personal computer. Some of these image pickup devices are equipped with a semiconductor image pickup element such as a CMOS (Complementary Metal-Oxide Semiconductor) type image sensor (for example, see Patent Document 1). Further, there has been proposed an image pickup device wherein a semiconductor image pickup element is arranged on a substrate, the substrate and an optical member having an element including a lens for converging light on the semiconductor image pickup element are formed in one body.

In the CMOS type image sensor, signal electric charges charged in every pixels of a photoelectric conversion section are taken out after they are amplified by amplifiers such as transistors provided individually on every pixels. Therefore, fixed pattern noise is generated undesirably by fluctuations in performance of an amplifier. Thus, a CDS (Correlated Double Sampling) circuit for outputting signal after removing generated fixed pattern noise is arranged to be adjacent to the photoelectric conversion section.

(Patent Document 1) JP-A No. 2003-60187

However, when light such as a sunbeam enters an analog circuit such as the CDS circuit in the occasion of picking-up image of a photographic subject, signal electric charges greater than those converted by the photoelectric conversion section photoelectrically are charged on a capacitor of an analog circuit portion. It causes a lower image quality of a picked-up image and it is a problem. Namely, there is provided a wiring layer such as an aluminum layer on a surface of the analog circuit portion so that the wiring layer blocks light entering into the analog circuit. However, in the analog circuit and a photoelectric converter, there is sometimes formed a space between the wiring layer provided on the analog circuit portion and a wiring layer provided on the photoelectric conversion section, for the reason of manufacturing. Therefore, this light shielding for the space is not sufficient and it is a problem.

SUMMARY OF THE INVENTION

An object of the invention is to provide an image pickup device capable of preventing a decline of image quality of captured images, and to provide an electronic apparatus having a built-in image pickup device.

To solve the above problem, an image pickup device according to the present invention includes an optical member, a semiconductor image pickup element, and an incident light preventing portion. The semiconductor image pickup element has a photoelectric converter for photoelectrically converting a light flux converged by the optical member into electric signal and for storing the electric signal thereon and an analog circuit for outputting the stored electric signal in the photoelectrical converter. The photoelectric converter has a wiring layer. The analog circuit has a wiring layer and is adjacent to the photoelectric converter. The incident light preventing portion is provided for preventing a light flux from a space between the wiring layer arranged on the analog circuit and the wiring layer arranged on the photoelectric converter.

For example, the above image pickup device may further include a substrate having an opening where a light flux converged by the optical member passes through. The semiconductor image pickup element is arranged on a back surface of the substrate. The photoelectric converter photoelectrically converts a light flux passing through the opening into electric signal and stores the electric signal thereon. The incident light preventing portion is a structure in which an end of the photoelectric converter close to the analog circuit is positioned on an almost same place to an end of the opening of the substrate along an optical axis of a light flux entering into the optical member, or an end of the photoelectric converter close to the analog circuit is positioned at an outside of the opening.

As another example, the above image pickup device may further include a substrate having an opening where a light flux converged by the optical member passes through. The semiconductor image pickup element is arranged on a back surface of the substrate. The photoelectric converter photoelectrically converts a light flux passing through the opening into electric signal and stores the electric signal thereon. The incident light preventing portion is a sealing resin having a light shielding effect and arranged so as to cover at least a part of a space between the wiring layer arranged on the analog circuit and the wiring layer arranged on the photoelectric converter.

As the other example, in the above image pickup device, the incident light preventing portion may be a shielding member with light shielding effect arranged on at least a part of a space between the wiring layer arranged on the analog circuit and the wiring layer arranged on the photoelectric converter.

BRIEF DESCRIPTION OF THE DRAWINGS

Embodiments will now be described, by way of example only, with reference to the accompanying drawings which are meant to be exemplary, not limiting, and wherein like elements numbered alike in several Figures, in which.

DETAILED DESCRIPTION OF THE INVENTION

Figure 1:
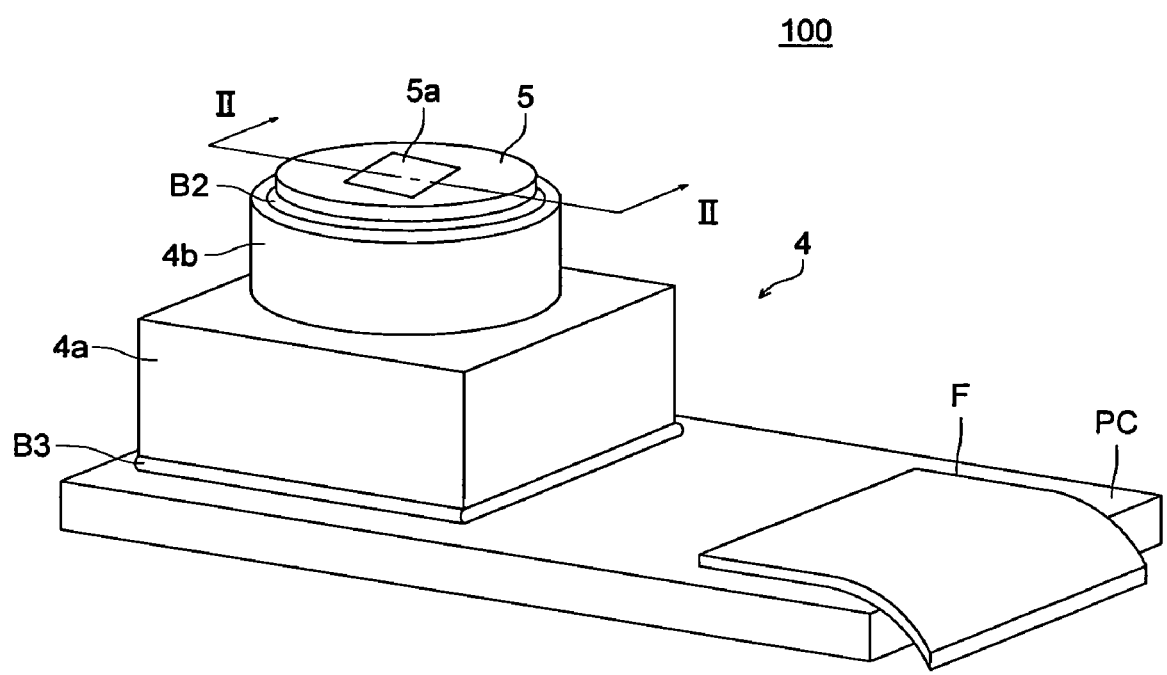
FIG. 1 is a perspective view showing an image pickup device of Embodiment 1 relating to the invention.

Preferred structures to attain the aforesaid objects of the invention will be explained as follows.

1) An image pickup device is provided with an optical member; a semiconductor image pickup element having a photoelectric converter and an analog circuit portion; and an incident light preventing portion. The photoelectric converter has a wiring layer, and it photoelectrically converts a light flux converged by the optical member into electric signal stores the electric signal thereon. The analog circuit has a wiring layer and is adjacent to the photoelectric converter. The analog circuit outputs the stored electric signal in the photoelectrical converter. The incident light preventing portion prevents a light flux from a space between the wiring layer arranged on the analog circuit and the wiring layer arranged on the photoelectric converter.

2) An image pickup device has therein an optical member, a substrate having an opening where a light flux converged by the optical member passes through and a semiconductor image pickup element attached on the back surface of the substrate. The semiconductor image pickup element has therein a photoelectric converter photoelectrically converting light that passed through the opening into electric signal and stores the electric signal, and an analog circuit that is arranged to be adjacent to the photoelectric converter and outputs the electric signal stored in the photoelectric converter. An end portion of the photoelectric converter close to the analog circuit is arranged so that it may be positioned substantially on an end portion of the opening on the substrate along the optical axis of a light flux entering into the optical member, or it may be positioned at the outside of the opening.

3) An image pickup device has therein an optical member, a substrate having an opening where a light flux converged by the optical member passes through and a semiconductor image pickup element attached on the back surface of the substrate. The semiconductor image pickup element has therein a photoelectric converter that photoelectrically converts a light flux that passes through the opening into electric signal and stores the electric signals and an analog circuit that is arranged to be adjacent to the photoelectric converter and outputs the electric signal stored in the photoelectric converter. There is provided sealing resin having light shielding effect so that it may cover at least a part of a space between a wiring layer provided on the analog circuit and a wiring layer provided on the photoelectric converter.

4) An image pickup device has therein an optical member and a semiconductor image pickup element provided with a photoelectric converter that photoelectrically converts light converged by the optical member into eclectic signal and stores the electric signal thereon and with an analog circuit that is arranged to be adjacent to the photoelectric converter and outputs the electric signals stored in the photoelectric converter. There is provided light shielding member having light shielding effect on at least a part of a space between a wiring layer provided on the analog circuit and a wiring layer provided on the photoelectric converter.

5) An electronic apparatus has therein the image pickup device described in any one of the Structures 1-4.

In the construction described in Structure 1, a photoelectric converter and an analog circuit arranged to be adjacent to the photoelectric converter are provided on the semiconductor image pickup element, and there is provided a incident light prevention portion that prevents incident light coming from a space between a wiring layer provided on the analog circuit portion and a wiring layer provided on the photoelectric converter. This makes it difficult for the light entering into the semiconductor image pickup element side of the device through the optical member to enter the analog circuit from a space between a wiring layer of the analog circuit and a wiring layer of the photoelectric converter. Owing to this, it is possible to restrain that electric charges are generated at the analog circuit based on incidence of light from a space to the analog circuit side of the device. Namely, it is possible to prevent that electric signal which is more than those converted photoelectrically by the photoelectric converter is stored on the analog circuit, and thereby to prevent a decline of image quality of captured images.

In the construction described in Structure 2, a photoelectric converter and an analog circuit arranged to be adjacent to the photoelectric converter are provided on the semiconductor image pickup element, and an end portion of the photoelectric converter on the analog circuit side is arranged so as to placed substantially on an end portion of the opening on the substrate along the optical axis of a light flux entering into the optical member, or so as to be positioned on the outside of the opening. This makes it difficult for the light entering the semiconductor image pickup element side of the device through the opening of the substrate to enter the analog circuit owing to this, it is possible to restrain that electric charges are generated at the analog circuit based on incidence of light for the analog circuit. Namely, it is possible to prevent that electric signal which is more than those converted photoelectrically by the photoelectric converter is stored on the analog circuit, and thereby to prevent a decline of image quality of captured images.

In the construction described in Structure 3, a photoelectric converter and an analog circuit arranged to be adjacent to the photoelectric converter are provided on the semiconductor image pickup element, and there is provided sealing resin having light shielding effect so that it may cover at least a part of a space between a wiring layer provided on the analog circuit and a wiring layer provided on the photoelectric converter. This makes it difficult for the light entering the semiconductor image pickup element side of the device through the opening of the substrate to enter the analog circuit from a space between a wiring layer of the analog circuit and a wiring layer of the photoelectric converter. Owing to this, it is possible to restrain that electric charges are generated at the analog circuit based on incidence of light from a space to the analog circuit. Namely, it is possible to prevent that electric signal which is more than those converted photoelectrically by the photoelectric converter is stored on the analog circuit, and thereby to prevent a decline of image quality of captured images.

In the construction described in Structure 4, a photoelectric converter and an analog circuit arranged to be adjacent to the photoelectric converter are provided on the semiconductor image pickup element, and there is provided a light shielding member having light shielding effect on at least a part of a space between a wiring layer provided on the analog circuit and a wiring layer provided on the photoelectric converter. This makes it difficult for the light entering into the semiconductor image pickup element side of the device through the optical member to enter the analog circuit from a space between a wiring layer of the analog circuit and a wiring layer of the photoelectric converter. Owing to this, it is possible to restrain that electric charges are generated at the analog circuit based on incidence of light from a space to the analog circuit. Namely, it is possible to prevent that electric signal which is more than those converted photoelectrically by the photoelectric converter are stored undesirably on the analog circuit, and thereby to prevent a decline of image quality of captured images.

In the construction described in Structure 5, even in an electronic apparatus having therein the image pickup device described in any one of Structures 1-4, it is possible to prevent that electric signal which are more than those converted photoelectrically by the photoelectric converter is stored on the analog circuit, in the same way as in the constructions described in Structures 1-4, and thereby to prevent a decline of image quality of captured images.

While the preferred embodiments of the present invention have been described using specific terms, such description is for illustrative purposes only, and it is to be understood that changes and variations may be made without departing from the sprit or scope of the appended claims.

With respect to the structures relating to the invention, specific embodiments will be explained as follows, referring to the drawings. The scope of the invention, however, is not limited to the illustrations.

Embodiment 1

Figure 2:
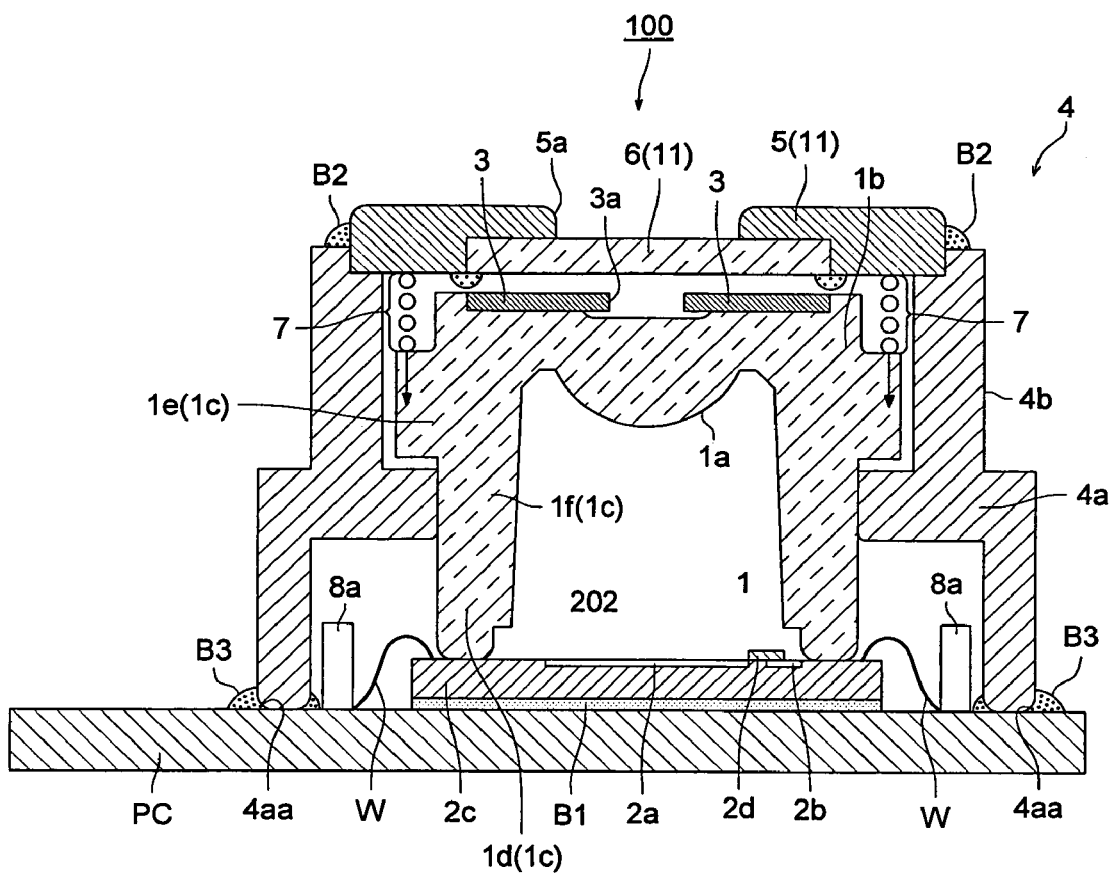
FIG. 2 is a partially-omitted sectional view of the image pickup device taken on line II-II in FIG. 1.

FIG. 1 is a perspective view showing an image pickup device of Embodiment 1 relating to the invention, and FIG. 2 is a partially-omitted sectional view of the image pickup device taken on line II-II in FIG. 1.

As shown in FIG. 1 and FIG. 2, image pickup device 100 of Embodiment 1 is provided with substrate PC, semiconductor image pickup element 202 provided on the substrate PC on the light source side, optical member 1 that converges light on the semiconductor image pickup element 202, diaphragm plate 3 that adjusts an amount of light entering the optical member 1, lens mount 4 representing an outer frame member covering the semiconductor image pickup element 202, light shielding plate 5 with light shielding effect provided on the lens mount 4, filter 6 supported by the light shielding plate 5, pressure member 7 that is arranged between the light shielding plate 5 and the optical member 1 and presses the optical member 1 against the substrate PC side, and positioning electric components 8a arranged at a prescribed position on the substrate PC for positioning the optical member 1.

The substrate PC is made by ceramic substrate, for example, and is formed so that its outer shape is substantially in a rectangular shape when it is viewed on a flat surface.

Flexible substrate F is further provided on the surface side of the substrate PC, and the flexible base plate F is connected electrically with the semiconductor image pickup element 202 through a prescribed wiring (not shown).

The semiconductor image pickup element 202 is mounted at a prescribed position of the substrate PC on its surface side through prescribed adhesives B1 so that photoelectric conversion section 2a (described later) may be arranged on the light source side. Then, a terminal for external connection (not shown) provided at a prescribed position of the semiconductor image pickup element 202 and a prescribed circuit on the substrate PC are electrically connected each other through wire W.

Further, the semiconductor image pickup element 202 is a member that includes, for example, CMOS (Complementary Metal-Oxide Semiconductor) type image sensor or CCD (Charge Coupled Device) type image sensor and is formed to be a thin and substantially rectangular plate. Specifically, on the semiconductor image pickup element 202, pixels are arranged two-dimensionally at almost a center on the upper surface of semiconductor substrate 2c such as, for example, P type Si substrate, then, photoelectric conversion section 2a in a rectangular form representing an image pickup area is arranged, and analog circuit section 2b for outputting signal electric charges charged on the photoelectric conversion section 2a is arranged to be adjacent to the photoelectric conversion section 2a.

As adhesives B1, there are given, for example, silver paste wherein silver powder is mixed with prescribed epoxy resin and mixtures of prescribed resins containing prescribed dyes and pigments having light blocking effects. Further, the adhesives B1 are resins or the like which can be hardened by applying thereon a process of heating the adhesion region, a process of applying irradiation of ultraviolet rays on the adhesion region, and other processes, or by applying the aforesaid processes on a multifunctional basis. General heat curing adhesives, UV curing adhesives, combined heat/UV curing adhesives and compound-process curing adhesives are used preferably.

Photoelectric conversion section 2a and analog circuit section 2b of the semiconductor image pickup element 202 will be explained as follows, referring to FIG. 3.

Figure 3:
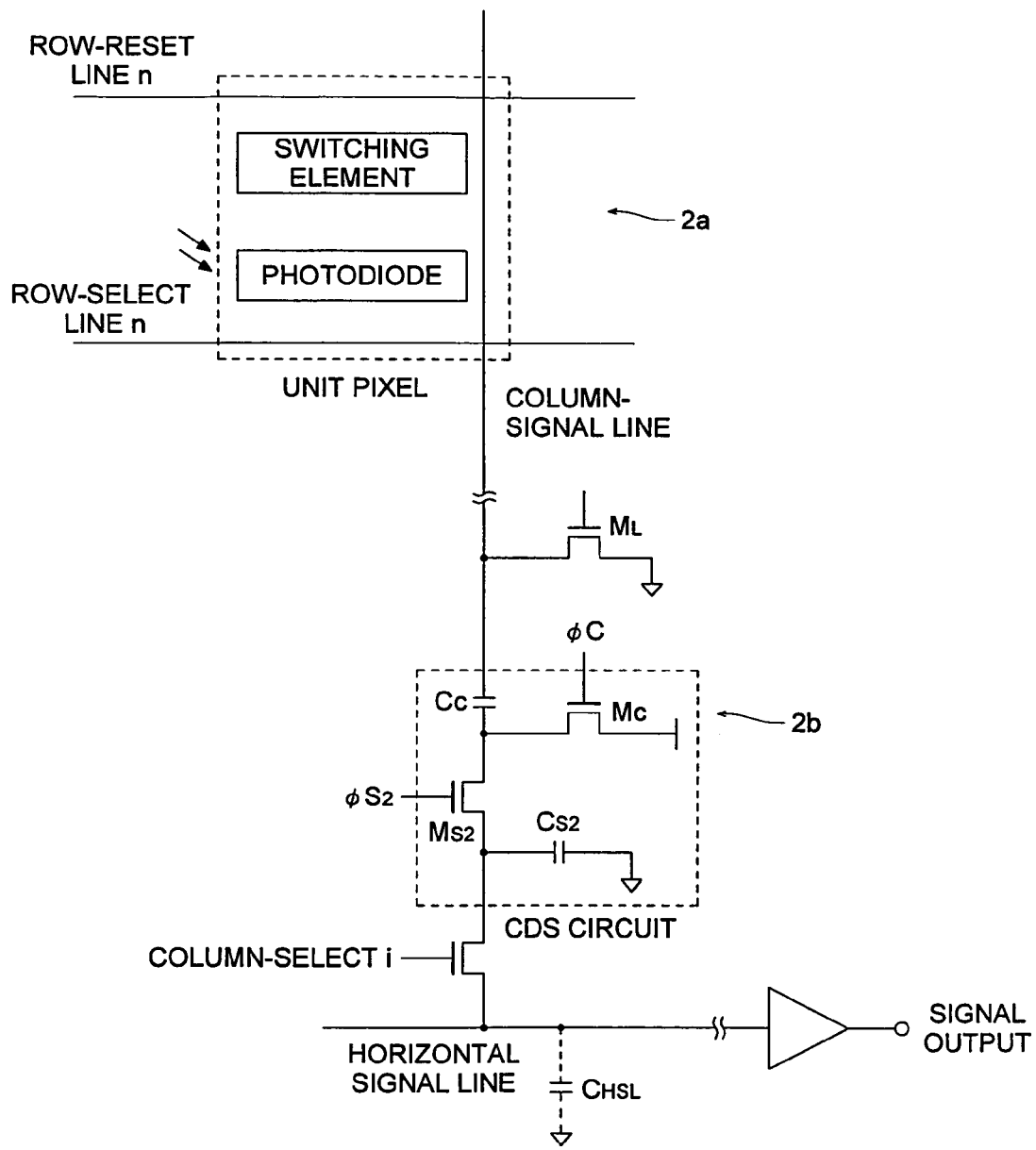
FIG. 3 is a diagram for illustrating a circuit structure for a photoelectric conversion section and an analog circuit portion of a semiconductor image pickup element provided on the image pickup device shown in FIG. 1.

Meanwhile, in FIG. 3, CMOS type image sensor, for example, is illustrated as the semiconductor image pickup element 202. In the case of outputting signal electric charges charged on the photoelectric conversion section 2a of the CMOS type image sensor, fixed pattern noise is generated undesirably by fluctuations in performance of an amplifier such as a MOS. (Metal Oxide Semiconductor) transistor. Therefore, there is provided CDS (Correlated Double Sampling) circuit for outputting after eliminating the generated fixed pattern noise, as analog circuit section 2b.

As shown in FIG. 3, when light enters photoelectric conversion section 2a of the semiconductor image pickup element 202, signal electric charges generated by the photodiode through photoelectric conversion are converted into changes in voltage of the photodiode operating as a capacitor equivalently, then, are amplified by MOS transistor whose gate is connected to the photodiode, and are outputted to CDS circuit as pixel signals through a column-signal line based on input pulse coming from a row-select transistor (switching element) connected with row-select line n.

Further, to the row-reset line n, there is connected a reset transistor (switching element) that outputs prescribed pulse for resetting signal electric charges accumulated in the photodiode, and the photodiode is reset based on input pulse coming from the reset transistor after outputting of pixel signals, and reset signals are outputted to CDS circuit from the photodiode through the column signal line.

Incidentally, load transistor $M_L$ is connected to the column signal line.

For each of the pixel signal and the reset signal which are inputted in the CDS circuit, clamping for capacitor $C_C$ and sampling for capacitor $C_{S2}$ are conducted, based on input pulse $\phi C$ coming from prescribed transistor $M_C$ representing a switching element connected to capacitor $C_C$, and on input pulse $\phi S2$ from transistor $M_{S2}$ connected to capacitor $C_{S2}$. Owing to this, signals in which fixed patterns noises are restrained are accumulated on capacitor $C_{S2}$. Signals thus accumulated are outputted based on input pulse i coming from column select transistor.

Accordingly, a light flux converged by optical member 1 is photoelectrically converged and stored as electric signal by photoelectric conversion section 2a of the semiconductor image pickup element 202, and analog circuit portion 2b outputs the stored electric signal.

Next, how to fit on substrate PC of semiconductor image pickup element 202 will be explained in detail as follows, referring to FIG. 4 and FIG. 5.

Figure 4:
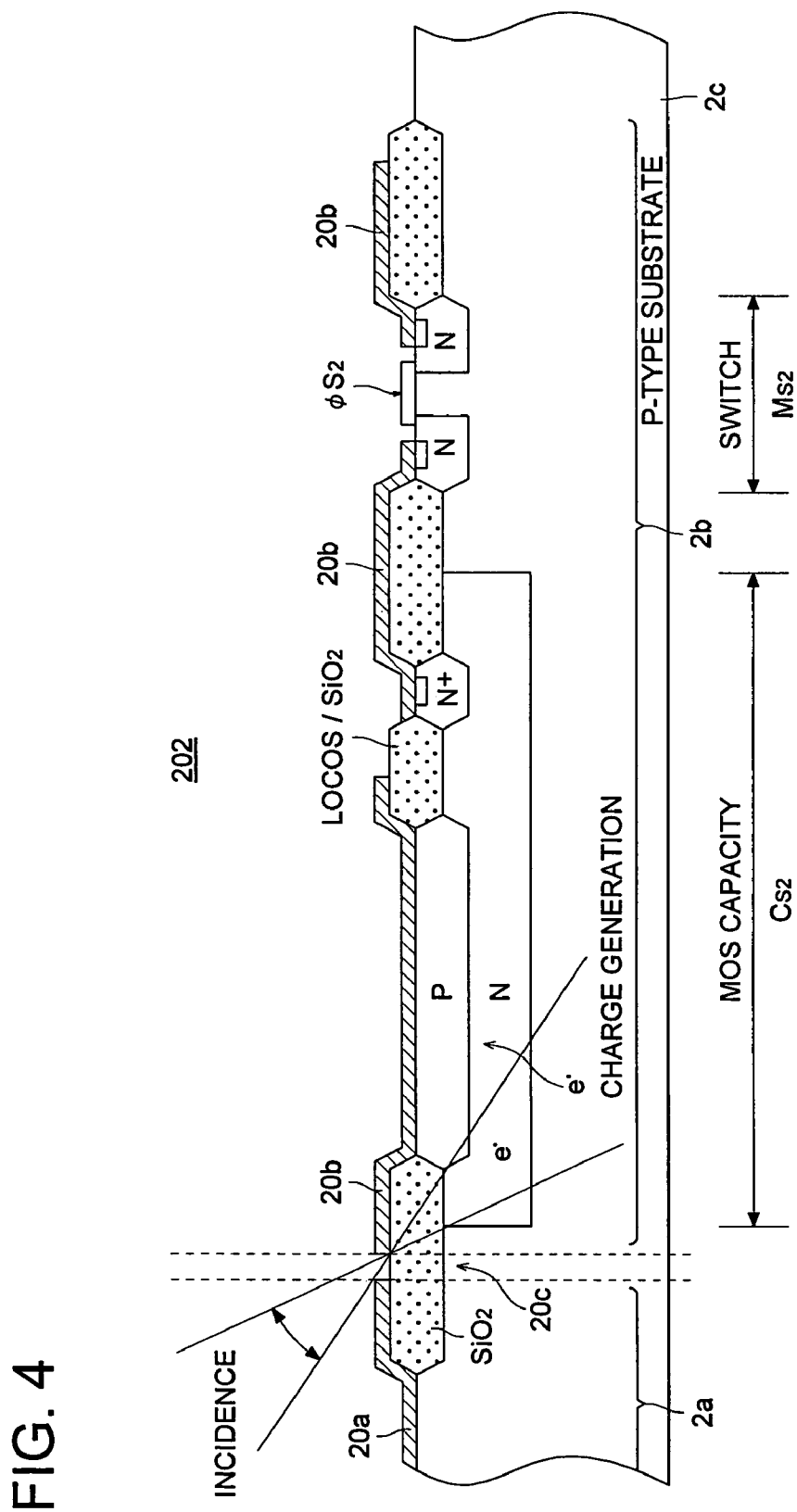
FIG. 4 is a diagram for illustrating a sectional structure of the semiconductor image pickup element.
Figure 5:
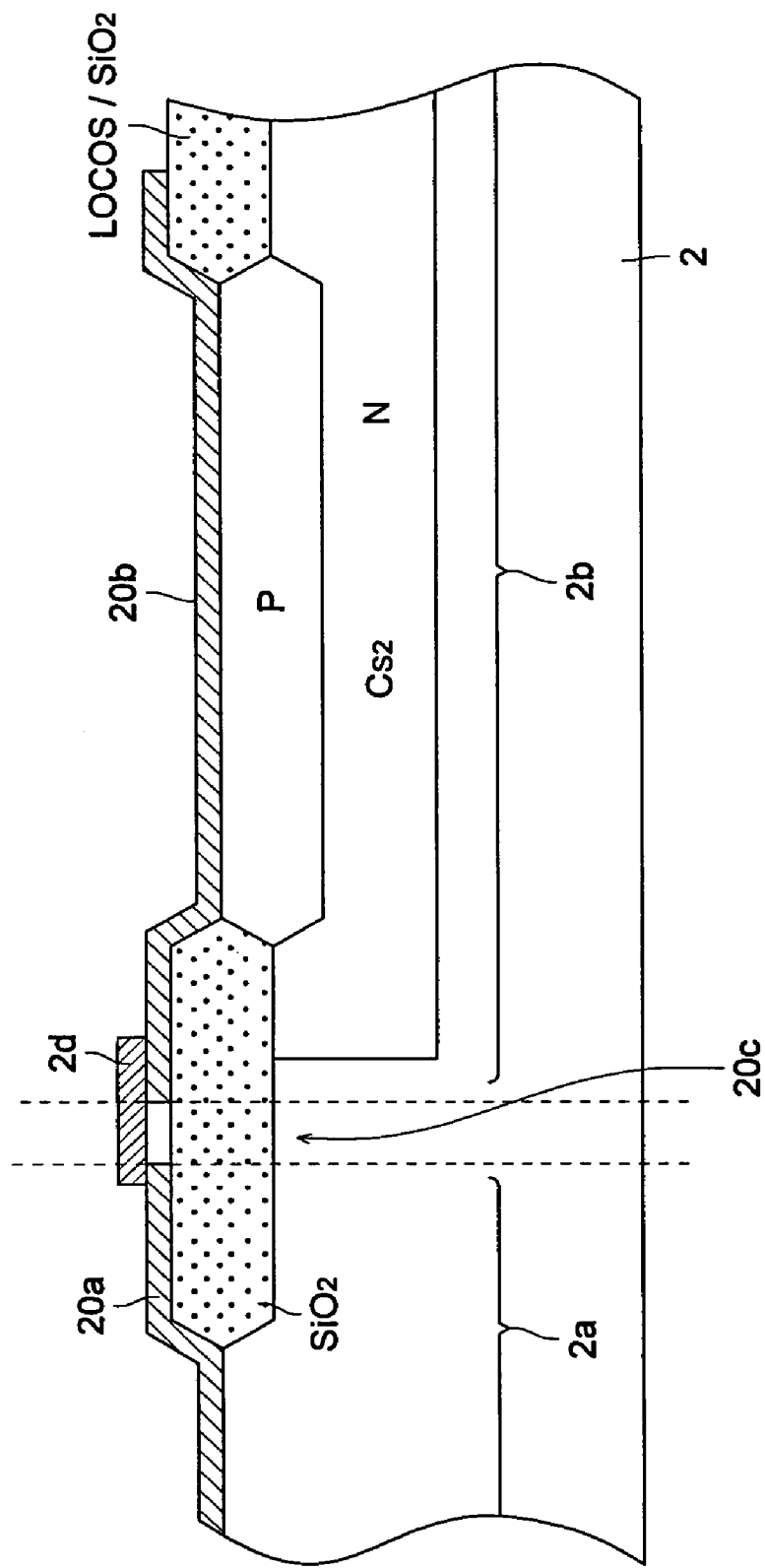
FIG. 5 is a diagram for illustrating how the semiconductor image pickup element and a substrate in FIG. 3 are arranged.

Here, FIG. 4 is a diagram for illustrating the cross sectional structure of the semiconductor image pickup element 202. Meanwhile, in FIG. 4 and FIG. 5, the cross sectional structure of the semiconductor image pickup element 202 is shown schematically, and wiring layers 20a and 20b only are hatched.

First, as shown in FIG. 4, wiring layers 20a and 20b each being formed of an aluminum layer are arranged on areas respectively of photoelectric conversion section 2a and analog circuit section 2b in the semiconductor image pickup element 202 where MOS transistors are constituted. Though each of these wiring layers 20a and 20b functions as a light shielding means to prevent that light enters the MOS transistor directly, it cannot be arranged between the photoelectric conversion section 2a and the analog circuit section 2b because of manufacturing reasons, and gap (space) 20c is formed by the wiring layer 20b provided on the analog circuit section 2b and by the wiring layer 20a provided on the photoelectric conversion section 2a. Therefore, there is a problem that electric charges are generated undesirably on MOS transistor $C_{S2}$ of the analog circuit section 2b by light entering the gap 20c at a prescribed angle.

Accordingly, in the semiconductor image pickup element 202 of the Embodiment 1, light shielding film (light shielding member) 2d made of a material having light shielding effect is provided to cover the whole gap 20c formed by the wiring layer 20b provided on the analog circuit section 2b and by the wiring layer 20a provided on the photoelectric conversion section 2a. More specifically, the light shielding film 2d is arranged so that it may cover an area from an end portion of the photoelectric conversion section 2a up to a prescribed position of the analog circuit section 2b. In this case, the light shielding film 2d constitutes an incident light preventing portion that prevents transmitting light from the gap 20c formed by the wiring layer 20b provided on the analog circuit section 2b and by the wiring layer 20a provided on the photoelectric conversion section 2a both in the semiconductor image pickup element 202.

Further, the light shielding film 2d may also be made of silver paste, for example. Namely, by making the light shielding film 2d under the same composition as that in the adhesives B1, coating of adhesives B1 for attaching substrate PC on the semiconductor image pickup element 202 and coating of light shielding film 2d can be conducted in the same process, which makes it possible to simplify manufacturing process for the image pickup device 100.

Optical member 1 is made of transparent plastic material, and tubular leg portion 1c and convex lens-shaped lens portion 1a are formed to be united in one bdy in the optical member 1 as shown in FIG. 2. The leg portion 1c is provided with four contact portions (only two of them are illustrated in FIG. 2) 1d which are formed on the lower end of the leg portion, upper leg portion 1e that is formed around on the upper end and of lower leg portion 1f formed between the contact portions 1d and the upper leg portion 1e. Further, the lens portion 1a is formed on the center of plate-shaped upper surface portion 1b that covers the upper end of the leg portion 1c. The contact portions 1d contact at prescribed positions on the upper surface of semiconductor image pickup element 202.

Though an illustration is omitted, the lower leg portion 1f is substantially in a D-shaped form that is formed when an outer circumference of a circle is cut by a line (chord) connecting two points on the outer circumference, in a horizontal cross-sectional view, and it forms a portion to be engaged.

Around the lens portion 1a on a top face of the upper surface portion 1b, there is fixed diaphragm plate 3 having opening 3a with adhesives as a first diaphragm that is made of a material having light blocking effect and regulates an f-number of the convex lens-shaped lens portion 1a.

Outside the optical member 1, there is arranged lens mount 4 that is made of a material having light blocking effect and constitutes an outer frame member. On the lens mount 4, there are provided prism-shaped lower portion 4a and cylindrical upper portion 4b, as shown in FIG. 1. Light shielding plate 5 is fixed on the upper end of the upper portion 4b of the lens mount 4 with adhesives B2. The light shielding plate 5 has, on its center, opening 5a as a second diaphragm. Filter 6 made of a material having infrared absorbing characteristics is cemented with adhesives on the lower surface of the light shielding plate 5 where the opening 5a is formed at the center of the light shielding plate 5. Cover member 11 is constituted with this light shielding plate 5 and the filter 6.

Lower end portion 4aa of the lower portion 4a is an adhesion portion where the lens mount 4 is attached on the substrate PC, and when the lower portion 4a of the lens mount 4 is brought into contact with the substrate PC to be fixed thereon, adhesives B3 are filled in a space between the lower end portion 4aa of the lower portion 4a and the substrate PC.

Since the substrate PC, the lens mount 4 and the cover member 11 are cemented to be brought into close contact to each other as in the foregoing, the optical member 1 and a surface of the semiconductor image pickup element 202 both covered by the substrate PC, the lens mount 4 and the cover member 11 are prevented from and protected against adhesion of dust an moisture and damages such as cracks representing environmental disturbances.

In other words, since the outer frame member composed of lens mount 4 and cover member 11 covers the optical member 1 and a surface of semiconductor image pickup element 202, image pickup device 100 has a structure for dust prevention and a structure for moisture prevention.

Though an illustration is omitted here, groove D representing an engaging portion corresponding to the lower leg portion 1f that is a portion to be engaged of the optical member 1 is formed on an inner circumferential surface of partition wall 4c located between the lower portion 4a and the upper portion 4b, and the lower leg portion 1f is engaged with the groove D an a close contact basis. Due to this engagement between the lower leg portion 1f and the groove D, the optical member 1 is positionally regulated by the lens mount 4 so that, for example, a rotation on the optical axis of lens portion 1a of the optical member 1.

Since the optical member 1 is positionally regulated by the lens mount 4, it is possible to arrange the optical member 1 at the prescribed position on the substrate PC by arranging the lens mount 4 at the prescribed position on the substrate PC through positioning based on positioning electric part 8a which will be described later. For example, it is possible to provide so that a center of photoelectric conversion section 2a of the semiconductor image pickup element may be made to agree with a center of the optical axis of the lens portion 1a of the optical member 1 that is engaged with the lens mount 4.

Further, since the optical member 1 is positionally regulated by the lens mount 4, the optical member 1 is hardly deviated from the prescribed position under the condition that the lens mount 4 is arranged at the prescribed position on the substrate PC, and for example, it is easy to keep the condition that a center of the optical axis of the lens portion 1a of the optical member 1 is made to agree with a center of photoelectric conversion section 2a of the semiconductor image pickup element 202.

In FIG. 2, pressure member 7 that is provided with an elastic member such as a coil spring, for example, is arranged between the optical member 1 and light shielding plate 5. When the light shielding plate 5 is attached on the lens mount 4, the pressure member 7 is pressed by the shielding plate 5, and the pressure member 7 is transformed elastically. This pressure member 7 presses the optical member 1 downward with prescribed pressing force to urge it against the semiconductor image pickup element 202. When the downward force is applied from the light shielding plate 5 in this case, the pressure member 7 is transformed elastically, and thereby, a buffer function to absorb the downward force is operated. Thus, the force is not transmitted to image pickup device 2 directly, resulting in an effect to prevent damage of image pickup device 2.

Positioning electric components 8a are, for example, a capacitor, a resistor and a diode, and they are arranged to correspond to four corners of the lens mount 4 to be adjacent to the lens mount 4 on substrate PC as shown in FIG. 2. This positioning electric components 8a are positioned to be near the fixed position in the case of fixing the lens mount 4 firmly on substrate PC, and it serves as an index for positioning the lens mount 4.

Meanwhile, the positioning electric component 8a has only to be an electric component necessary for image pickup device 100, without being limited, for example, to a capacitor, a resistor and a diode.

On the substrate PC, there may be provided electric components (not shown) necessary for operating image pickup device 100 and for conducting image processing, which makes the image pickup device 100 to be mounted on various electronic apparatus easily as one unit.

Next, an electronic apparatus on which an image pickup device relating to the invention is mounted will be explained, using the image pickup device 100 as an example.

Figure 6:
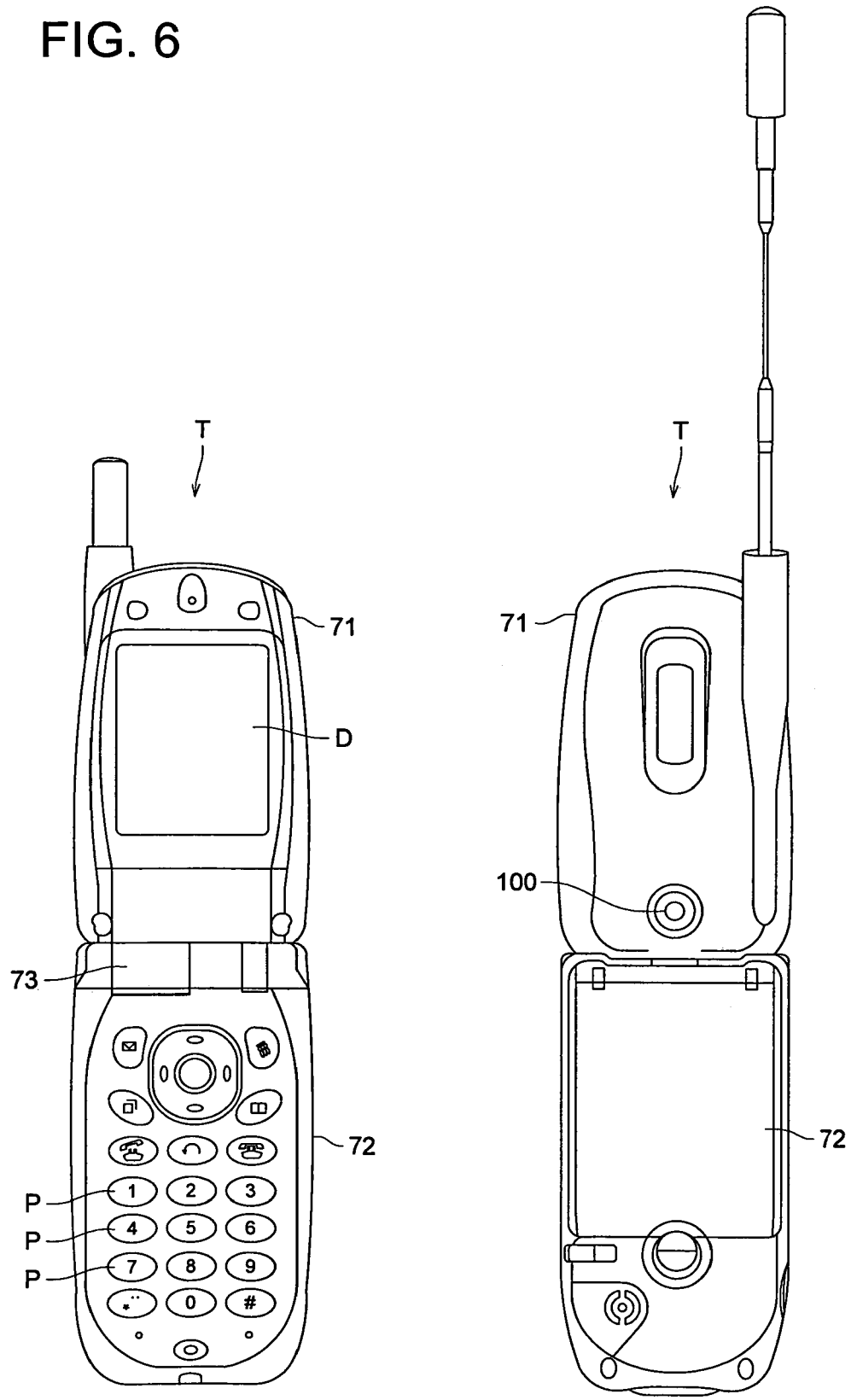
FIG. 6 shows a front view and a rear view showing an example of a cell-phone on which an image pickup device of the invention is mounted.

As shown in FIG. 6, an electronic apparatus is, for example, flip phone T (hereinafter, referred to as cell-phone T) in which upper casing 71 representing a case equipped with display screen D is connected with lower casing 72 equipped with operation button P through hinge 73. The image pickup device 100 is housed below the display screen D on an inner surface side (the side having the display screen D), so that the image pickup device 100 can take in light from the outer surface of the upper casing 71.

By making cell-phone T to have built-in slimmed image pickup device 100 as stated above, it is possible to make cell-phone T to be more thin, and by using functions of the image pickup device 100 properly corresponding to a distance to a photographic subject or to an environment for image pickup, the cell-phone T can be made to have a high added value.

Incidentally, since other constituent factors of the cell-phone T are known widely, an explanation for them will be omitted here.

As stated above, light shielding film 2d is provided to cover the gap 20c formed between wiring layer 20b provided on analog circuit section 2b and wiring layer 20a provided on photoelectric conversion section 2a on the semiconductor image pickup element 202, in the image pickup device 100. Therefore, light entering into the semiconductor image pickup element 202 through the optical member 1 is made to be difficult to enter the analog circuit section 2b through the gap 20c formed between wiring layer 20b of analog circuit section 2b and wiring layer 20a of photoelectric conversion section 2a. Owing to this, it is possible to inhibit that electric charges are generated on the analog circuit section 2b when sunlight enters semiconductor substrate 2c on the analog circuit section 2b side through the gap 20c. Namely, it is possible to prevent that signal electric charges which are more than those converted photoelectrically by the photoelectric conversion section 2a are undesirably accumulated in the analog circuit section 2b, which prevents a decline of image quality for images taken.

Incidentally, although an example to cover the whole of the gap 20c of the semiconductor image pickup element 202 has been shown as light shielding film 2d in the image pickup device 100 of the Embodiment 1, the embodiment of the invention is not limited to this. Any light shielding film covering at least a part of the gap 20c is suitable for the embodiment. That is, it is also possible to provide light shielding film 2d of about 0.5 mm at a prescribed position of gap 20c. In other words, a basis is as follows; unwanted electric charges by analog circuit section 2b is generated when sunlight enters the analog circuit section 2b at a prescribed angle, and therefore, light shielding film 2d that is on the level to prevent incident light at prescribed angle at the most is good enough.

Embodiment 2

Figure 7:
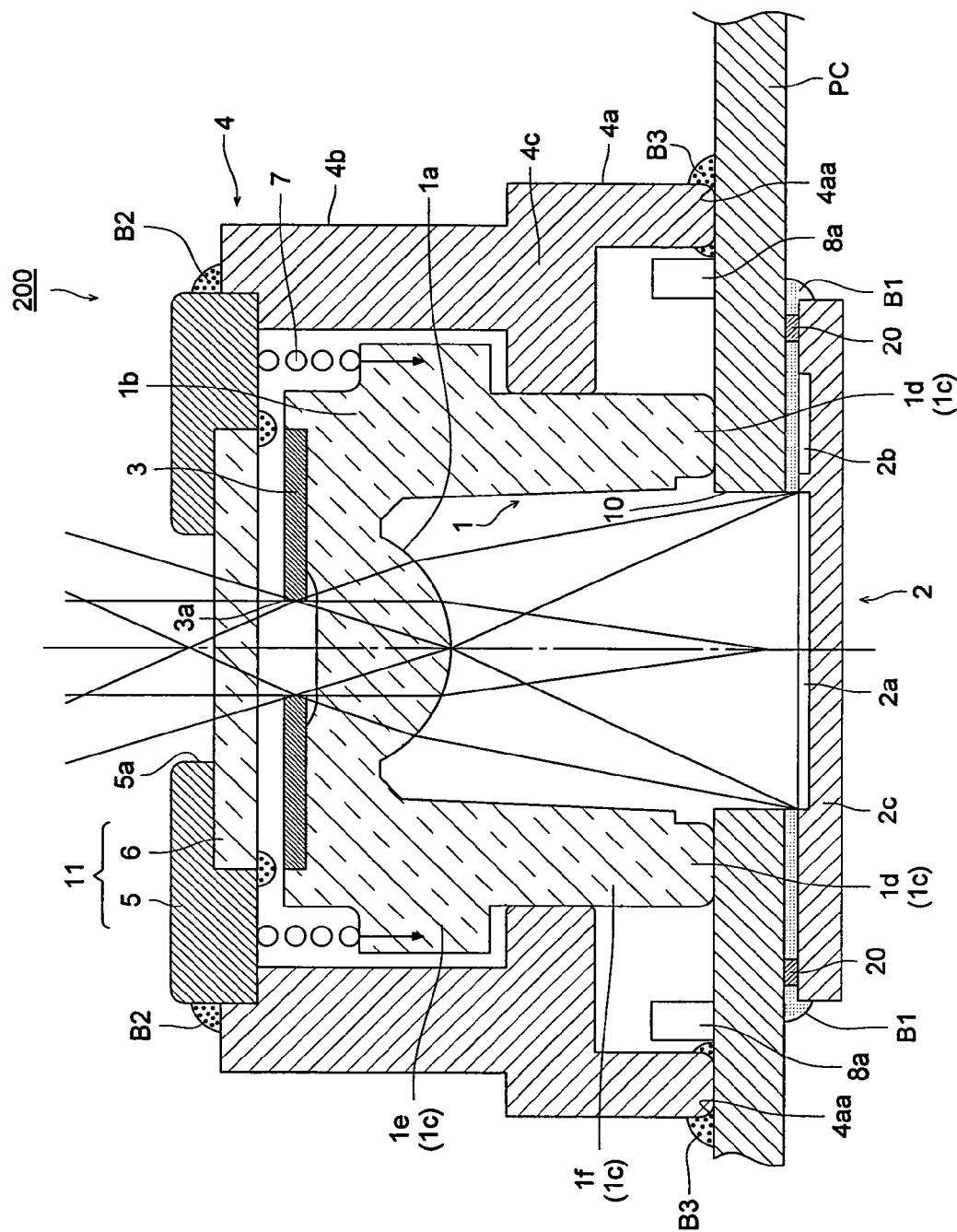
FIG. 7 is a partially-omitted sectional view showing an image pickup device of Embodiment 2 to which the invention is applied.
Figure 8:
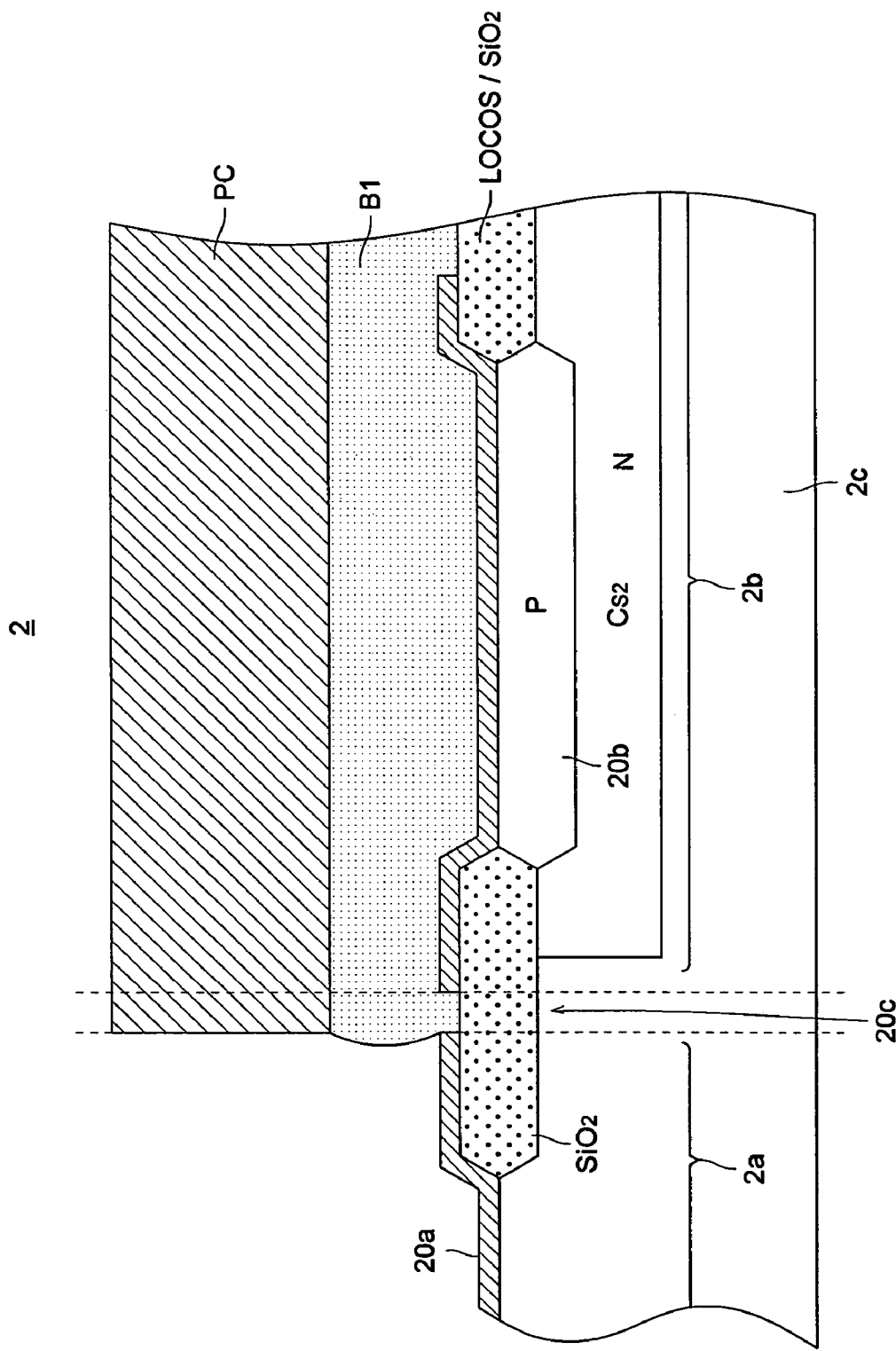
FIG. 8 is a diagram for illustrating a sectional structure of the semiconductor image pickup element provided on the image pickup device shown in FIG. 7.

FIG. 7 is a partially-omitted sectional view showing image pickup device 200 in Embodiment 2 relating to the invention, and FIG. 8 is a diagram for illustrating a sectional structure of semiconductor image pickup element 2 provided on the image pickup device 200.

As shown in FIG. 7 and FIG. 8, the image pickup device 200 in Embodiment 2 is provided with semiconductor image pickup element 2 in a way to cover opening 10 with semiconductor image pickup element 2 from the back side of the substrate PC on which the opening 10 that is substantially in a rectangular form.

The semiconductor image pickup element 2 is attached on the back surface of the substrate PC in a way that the photoelectric conversion section 2a is exposed from the front side of the substrate PC through the opening 10. Specifically, semiconductor image pickup element 2 is attached on the back surface of the substrate PC through plural bumps 20 provided at prescribed intervals. The semiconductor image pickup element 2 is connected electrically to a wiring (not shown) formed at a prescribed position on the reverse side of the substrate PC, by the bumps 20. Herein, a light flux converged by optical member 1 passes through the opening 10, and photoelectrically converged into electric signal and stored by photoelectric conversion section 2a.

Meanwhile, the bump 20 is composed, for example, of copper, nickel, gold, palladium, alloy containing the aforesaid metals or of these metals. Further, as bump 20, for example, there are given stud bump, plated bump and metalized bump.

In the semiconductor image pickup element 2, an end portion of photoelectric conversion section 2a on the analog circuit section 2b side and an end portion of opening 10 on the substrate PC are attached on the reverse side of the substrate PC in a way that they overlap each other substantially in the optical axis direction of light entering the optical member 1. In this case, the substrate PC and the semiconductor image pickup element 2 constitute a incident light prevention portion that prevents incident light coming from gap 20c formed between wiring layer 20b of analog circuit section 2b of semiconductor image pickup element 2 and wiring layer 20a of photoelectric conversion section 2a.

The semiconductor image pickup element 2 is provided with adhesives B1 representing sealing resin (incident light prevention portion) having light blocking effect so that gap 20c formed between wiring layer 20b provided on analog circuit section 2b and wiring layer 20a provided on photoelectric conversion section 2a may be covered, and it is adhered to the substrate PC through the adhesives B1. More specifically, the adhesives B1, for example, is filled in a space formed between gap 20c formed between the reverse side of the substrate PC and The semiconductor image pickup element 2 and a section on the end portion, so that a space between the semiconductor image pickup element 2 and the substrate PC may be sealed.

Herein, the front side (front surface) of substrate PC means a side of the substrate PC where a light flux converged by the optical member 1 enters into, and the back side (back surface) of substrate PC means the opposite side of the front side.

Incidentally, adhesives B1 having non-conducting properties may be used for preventing short circuit between electrodes.

In image pickup device 200, semiconductor image pickup element 2 is arranged so that an end portion of photoelectric conversion section 2a on the analog circuit section 2b side and an end portion of opening 10 on the substrate PC may be overlapped substantially in the optical axis direction of light entering the optical member 1, as stated above. Further, the semiconductor image pickup element 2 is attached on the substrate PC through adhesives B1 that is provided to cover the gap 20c formed between wiring layer 20b provided on the analog circuit section 2b and wiring layer 20a provided on the photoelectric conversion section 2a and a portion on the end section side. Therefore, it is possible to make it difficult for light that enters the semiconductor image pickup element 2 side through opening 10 to enter the analog circuit section 2b from gap 20c between wiring layer 20b of the analog circuit section 2b and wiring layer 20a of the photoelectric conversion section 2a. Due to this, it is possible to inhibit that electric charges are generated on the analog circuit section 2b when sunlight enters the analog circuit section 2b side of the semiconductor substrate 2c from the gap 20c. Namely, it is possible to prevent that signal electric charges which are more than those converted photoelectrically by the photoelectric conversion section 2a are undesirably accumulated in the analog circuit section 2b, which prevents a decline of image quality for images taken.

Incidentally, although adhesives B1 for sealing a space formed between semiconductor image pickup element 2 and substrate PC is provided at a portion covering from gap 20c of the semiconductor image pickup element 2 to a portion on the end section side, in the image pickup device 200 of the present embodiment, the invention is not limited to this, and the adhesives have only to be provided to cover at least a part of the gap 20c.

Further, in the Embodiment 2, though there is illustrated semiconductor image pickup element 2 wherein an end portion of photoelectric conversion section 2a on the analog circuit section 2b side and an end portion of opening 10 on the substrate PC are overlapped substantially in the optical axis direction of light entering the optical member 1, the invention is not limited to this, and an end portion of the photoelectric conversion section 2a on the analog circuit section 2b side may also be arranged to be positioned outside the opening 10. Owing to this, it is possible to make it difficult for light entering the semiconductor image senor 2 side through the opening 10 to enter the analog circuit section 2b from gap 20c.

Meanwhile, the invention is not limited to the aforesaid embodiments, and it can be subjected to various improvements and design changes without departing from the spirit and scope of the invention.

For example, though a CDS circuit is illustrated as the analog circuit section 2b, the invention is not limited to this, and any type of analog circuit can be employed if it is one for outputting electric signals accumulated in the photoelectric conversion section 2a. Further, circuit structures of the analog circuit section 2b and the photoelectric conversion section 2a are not limited to those described above.

Further, though adhesives B1 is illustrated as sealing resins in the aforesaid Embodiments 1 and 2, the invention is not limited to these, any type one can be employed, if it is a member having at least light shielding properties.

Further, though cell-phone T is illustrated as an electronic apparatus in the aforesaid embodiment, the invention is not limited to this, and any type of electronic apparatus can naturally be employed, if it is one capable of having built-in image pickup device 100 or 200.

What is claimed is:

1. An image pickup device comprising:
    an optical member;
    a semiconductor image pickup element including
        a photoelectric converter having a wiring layer, for photoelectrically converting a light flux converged by the optical member into electric signal and for storing the electric signal thereon, and
        an analog circuit having a wiring layer and being adjacent to the photoelectric converter, for outputting the stored electric signal in the photoelectrical converter; and
    an incident light preventing portion arranged directly on the semiconductor image pickup element for preventing the light flux from entering into the analog circuit from a space between the wiring layer arranged on the analog circuit and the wiring layer arranged on the photoelectric converter.

2. The image pickup device of claim 1, further comprising:
    a substrate having an opening where a light flux converged by the optical member passes through,
    wherein the semiconductor image pickup element is arranged on a back surface of the substrate,
    the photoelectric converter photoelectrically converts a light flux passing through the opening into electric signal and stores the electric signal thereon, and
    the incident light preventing portion is a structure in which
        an end of the photoelectric converter close to the analog circuit is positioned on an almost same place to an end of the opening of the Substrate along an optical axis of a light flux entering into the optical member, or an end of the photoelectric converter close to the analog circuit is positioned at an outside of the opening.

3. The image pickup device of claim 1, further comprising:
a substrate having an opening where a light flux converged by the optical member passes through,
wherein the semiconductor image pickup element is arranged on a back surface of the substrate,
the photoelectric converter photoelectrically converts a light flux passing through the opening into electric signal and stores the electric signal thereon, and
the incident light preventing portion is a sealing resin having a light shielding effect and arranged so as to cover at least a part of a space between the wiring layer arranged on the analog circuit and the wiring layer arranged on the photoelectric converter.

4. The image pickup device of claim 1,
wherein the incident light preventing portion is a light shielding member with light shielding effect arranged on at least a part of a space between the wiring layer arranged on the analog circuit and the wiring layer arranged on the photoelectric converter.

5. An electronic apparatus comprising the image pickup device of claim 1.

* * * * *